(12) United States Patent
Iima (10) Patent No.: US 7,213,219 B2
(45) Date of Patent: May 1, 2007

(54) FUNCTION VERIFICATION METHOD

(75) Inventor: Tomofumi Iima, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 1 day.

(21) Appl. No.: 11/117,483

(22) Filed: Apr. 29, 2005

(65) Prior Publication Data

US 2005/0251768 A1  Nov. 10, 2005

(30) Foreign Application Priority Data

May 6, 2004  (JP)  ............................. 2004-137306

(51) Int. Cl.
*G06F 17/50* (2006.01)
(52) U.S. Cl. .............................. 716/4; 716/5
(58) Field of Classification Search .................. 716/4, 716/5
See application file for complete search history.

(56) References Cited

U.S. PATENT DOCUMENTS 6,449,750 B1 *  9/2002  Tsuchiya ..................... 716/4
6,701,504 B2 *  3/2004  Chang et al. ................ 716/10
2001/0027539 A1 * 10/2001  Nozuyama .................. 714/33
2002/0108056 A1 *  8/2002  Hatakeyama ............... 713/200
2005/0004777 A1 *  1/2005  Houlihane ................... 702/119

OTHER PUBLICATIONS

"Reuse Methodology Manual, Chapter 11, System-Level Verification Issues," 3rd Edition, 2002, Kluwer Academic Publishers, ISBN 1-4020-7141-8, pp. 239-263.
"Nikkei Microdevices", Jan. 2003 Edition, pp. 146-149.
"Nikkei Microdevices", Feb. 2003 Edition, pp. 133-136.
"Nikkei Microdevices", Mar. 2003 Edition, pp. 126-130.

* cited by examiner

*Primary Examiner*—Sun James Lin
(74) *Attorney, Agent, or Firm*—Foley & Lardner LLP (57) ABSTRACT

A function verification method comprises preparing a first function block that can execute the required functions in a semiconductor integrated circuit, preparing a second function block to be a verification target having a substantially identical configuration as the first function block and verifying functions of the second function block using the first function block.

13 Claims, 10 Drawing Sheets

PRIOR ART

Fig. 11

PRIOR ART

FUNCTION VERIFICATION METHOD

BACKGROUND OF THE INVENTION

1. Field of the Invention

The present invention relates to a function verification method, and more particularly to a function verification of the function blocks of a semiconductor integrated circuit.

2. Description of the Related Art

Figure 10:
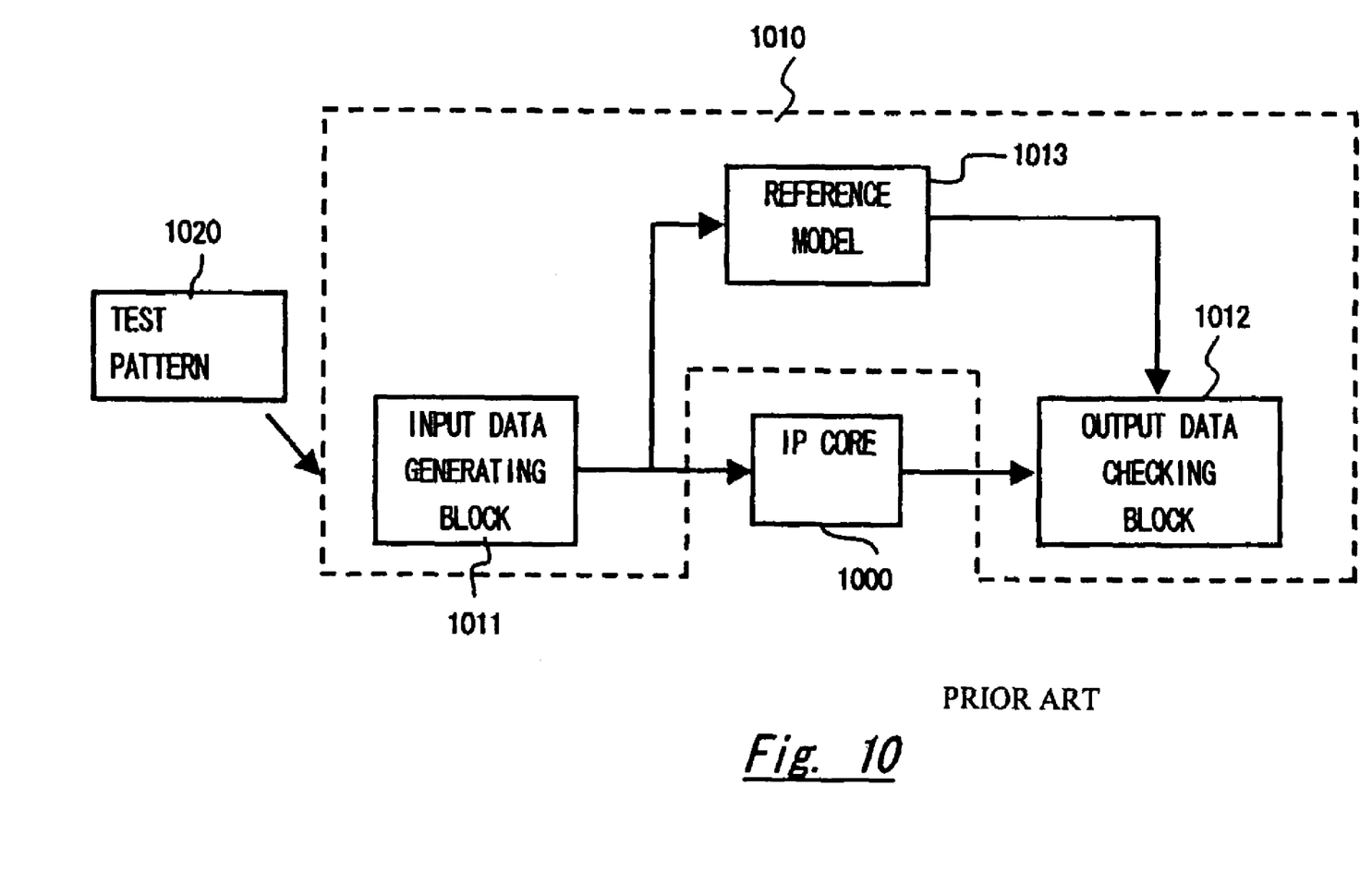
FIG. 10 is a diagram depicting a conventional test bench and IP core.

Recently it has become common to mount many function blocks on an LSI. When a large-scale LSI is designed, it is standard to design it using a circuit function block (hereafter IP core) previously designed. FIG. 10 is a block diagram depicting the relationship of the test bench 1010 and the test pattern 1020 constructed for the function verification of the IP core 1000. Normally the test bench 1010 comprises an input data generation block 1011 for generating input data to the IP core 1000, an output data check block 1012 for checking the expected value of output data, and a reference model 1013.

The input data generation block 1011 generates input data to the IP core 1000 based on the test pattern 1020. The output data check block 1012 checks whether the output of the IP core 1000 is correct based on the output of the reference model.

Figure 11:
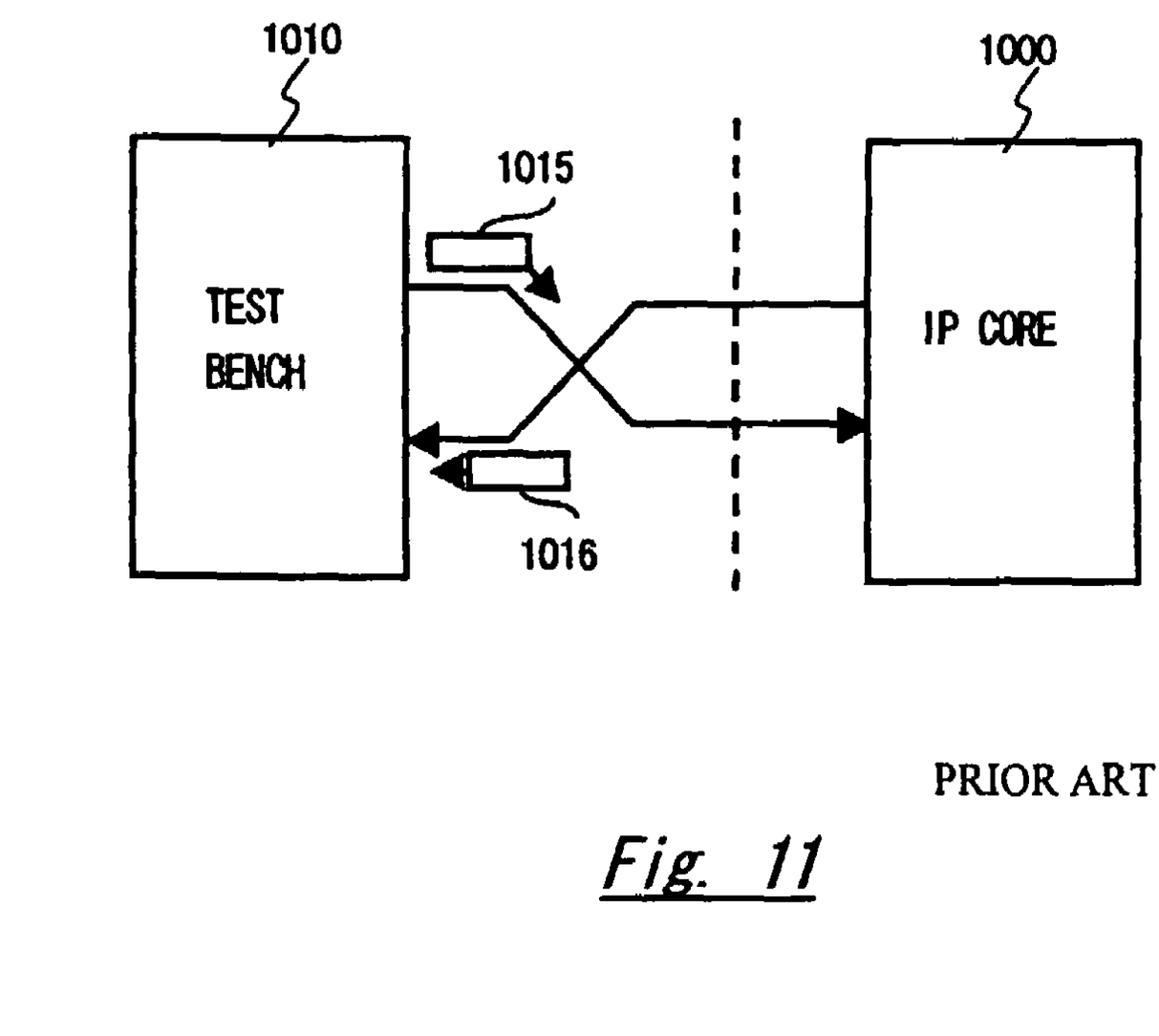
FIG. 11 is a diagram depicting a conventional test bench and IP core.

FIG. 11 is a diagram depicting an example of the IP core 1000 and the test bench 1010 shown in FIG. 10. The test bench 1010 shown in FIG. 11 is drawn to depict the relationship between the IP core 1000, for implementing the communication interface function in frame units, such as Ethernet®, and the test bench 1010. Just like FIG. 10, the test bench 1010 comprises an input data generation block 1011 to input data to the IP core 1000 of the verification target and the output data check block 1012 for the output data from the IP core 1000, although neither are illustrated in FIG. 11. In FIG. 11, the input data to the IP core 1000 is shown as the frame 1015, and the output data from the IP core 1000 as the frame 1016. This is because Ethernet® is an interface which performs communication in frame units. All data exchanged between the test bench 1010 and the IP core 1000, connected to the test bench 1010, is in frame units. The broken line in FIG. 11 indicates the boundary between the test bench 1010 and the IP core 1000, and the left side of the broken line in FIG. 11 is the test bench 1010 and the right side of the broken line is the IP core 1000.

In FIG. 11, the test bench 1010 sends the frame data 1015 to the IP core 1000 of the verification target. This becomes the input to the IP core 1000. In FIG. 11, the test bench 1010 receives the frame data 1016 from the IP core 1000 of the verification target. This becomes the output from the IP core 1000 of the verification target. To verify the operation of the IP core 1000 the test bench 1010 collates the frame of the output data from the IP core 1000 and the expected value of the output.

If the above mentioned IP core is embedded in the LSI as an already designed function block when the LSI is designed, then the function of the entire LSI must be verified after the IP core is embedded in the LSI. However in most conventional cases, the above mentioned test bench 1010 of the IP core 1000 and the test pattern 1020 cannot be directly used to construct a test bench to verify LSI functions. Even when a function is verified only for the IP core, problems occur at times when using the test bench 1010 and the test pattern 1020. This is because when the IP core 1000 is designed, the test bench 1010 and the test pattern 1020 are designed and developed to verity the functions of the IP core 1000 inside another LSI. In order to construct a verification environment for an entire LSI which is newly designed, it is necessary to either integrate necessary functions, of all functions of the test bench 1010, into the verification environment for the entire LSI, or to construct the test bench from scratch. Such a construction of a test bench, however, increases the development period and the development cost.

The background technology on the verification of functions of an LSI is stated in "Reuse Methodology Manual", Third Edition, 2002, Kluwer Academic Publishers, ISBN 1-4020-7141-8, pp. 239–263, "NIKKEI MICRODEVICES", 2003 January Edition, PP. 146–149, "NIKKEI MICRODEVICES", 2003 February Edition, PP. 133–136, and "NIKKEI MICRODEVICES", 2003 March Edition, PP. 126–130, for example.

As described above, a conventional IP core has a problem in that the time required for the verification of functions of an IP core increases if an IP core is used.

SUMMARY OF THE INVENTION

A function verification method comprises preparing a first function block that can execute the required functions in a semiconductor integrated circuit, preparing a second function block to be a verification target having a substantially identical configuration as the first function block and verifying functions of the second function block using the first function block.

A function verification method comprises generating frames for testing by a first function block, inputting the frames for testing to a second function block having a substantially identical configuration as the first function block and verifying functions of the second function block according to the output data that is output by the second function block based on the frames for testing.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of the present invention will now be described with reference to the drawings. In the drawings a same composing element is denoted with a same reference numeral. In the LSI design of the present invention, the logic thereof of the LSI circuit is described by RTL (Register Transfer Level) for describing up to the level where logical synthesis is possible using a programming language called HDL (Hardware Description Language). Then using a logical verification device, the function of circuit description described by RTL (hereafter RTL description) is verified. This verification is performed in each block level and one chip level. The IP core, to be described in this embodiment, has a plurality of registers and combined circuits described by RTL as the content of the function blocks thereof.

Figure 1:
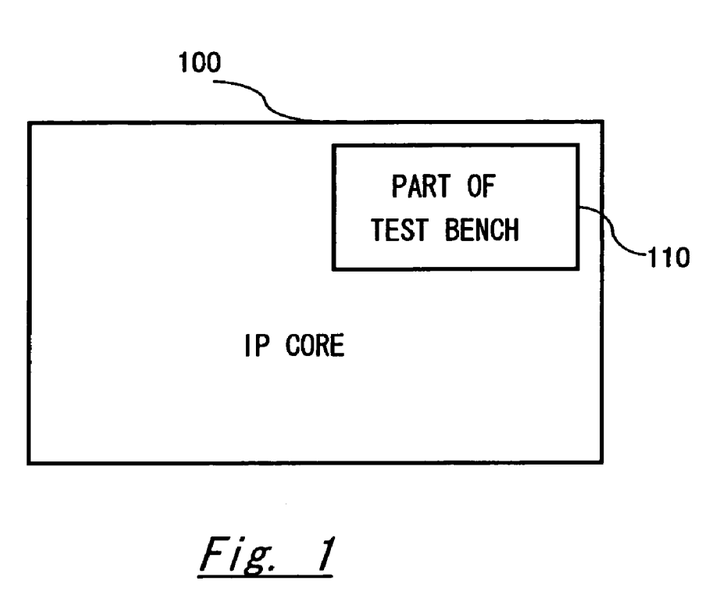
FIG. 1 is a diagram depicting the IP core according to an embodiment of the present invention.

FIG. 1 is a diagram depicting the IP core 100 according to an embodiment of the present invention. This IP core 100 is designed by RTL description as described above, and corresponds to a function block for implementing functions required on a chip on which the LSI circuit is created. In the IP core 100 according to this embodiment, a test section 110 for executing function verification is installed within the circuit of the RTL description. The test section 110 will be described in detail later. In the stage of designing the IP core 100 of the present invention, a circuit corresponding to the test bench function (or a part thereof) is included in the IP core 100. In other words, the IP core 100 is provided by including description corresponding to the test section 110 in the RTL description for describing a circuit of the IP core 100.

Specifically the test section 110 of this embodiment comprises a register group for setting data for testing which is sent to the IP core 100 when the functions of the IP core 100 are verified, and the test data generation block. This test section 110 will be described in detail later.

The functions of the IP core 100 which the test section 110 can verify are those functions of the functions which the IP core 100 executes as the function block. All functions of the LSI where the IP core 100 is embedded are verified by another test bench. The portion on function verification of the entire LSI, where the IP core 100 was embedded in the past, is not included in this test section 110.

Figure 2:
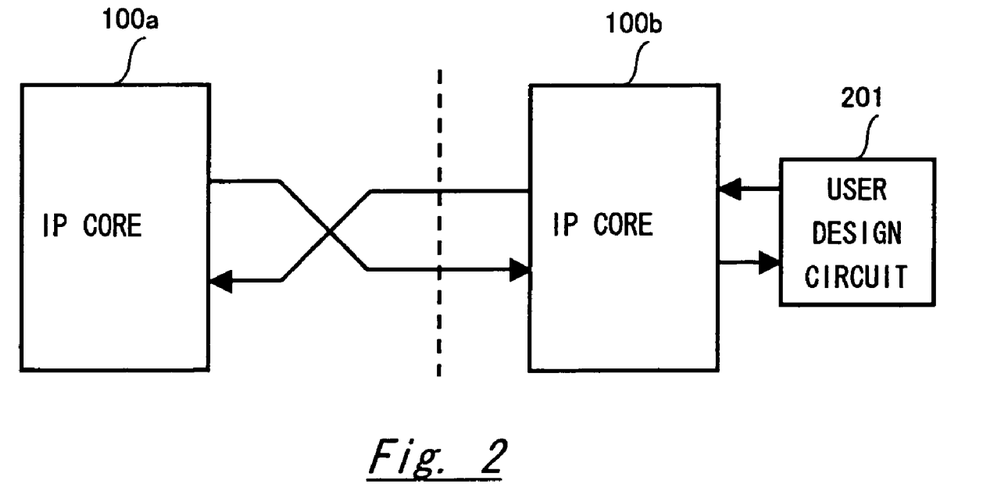
FIG. 2 is a block diagram depicting the function verification of the IP core using the IP core of the present invention.

Operation of the verifying functions of the IP core 100 created in this way will now be described. FIG. 2 is a diagram depicting the configuration when the function verification of the IP core 100 according to the embodiment of the present invention is performed. In this embodiment, the IP core performs a communication operation. Therefore, as FIG. 2 shows, according to this embodiment, two IP cores 100 with an identical configuration are inter-connected. In the configuration shown in FIG. 2, the first IP core 100a (left side of the broken line in FIG. 2) described by RTL is used as a test bench for verifying the functions of the second IP core 100b. The second IP core 100b (right side of the broken line in FIG. 2) described by RTL operates as a function block for executing the original functions of the IP core 100.

In other words, the IP core 100a is used for the verification operation using the test section 110 installed in the IP core 100 shown in FIG. 1. The IP core 100a operates as a test bench for function verification of the IP core 100b, or a part of the test bench of the entire LSI. Therefore the IP core 100a is not for executing a part of the functions of the general operations of the entire LSI. The IP core 100b, on the other hand, operates as a function block in the LSI, so as a rule the IP core 100b does not operate in standalone-status. In the IP core 100b, other circuit functions are added, for example, a function to store frame data, such as a memory function, or a frame processing function. The user design circuit 201 in FIG. 2 shows this additional circuit.

As mentioned above, the IP core 100a for the test bench can be used in standalone status as a test bench for performing basic function verification only for the IP core 100b. The IP core 100a can also be embedded in the test bench for the entire LSI and can operate as part of the test bench of the LSI when function verification is performed for the entire LSI. This is because the test section 110 embedded in the IP core 100 is the test section 110 for verifying the basic functions of the IP core 100. The IP core 100b of this embodiment in FIG. 2 is a circuit for data communication. More particularly, the IP core 100b is a communication interface circuit when data is communicated in frame units, such as the case of Ethernet®, and executes functions to transmit and receive frame data.

Figure 3:
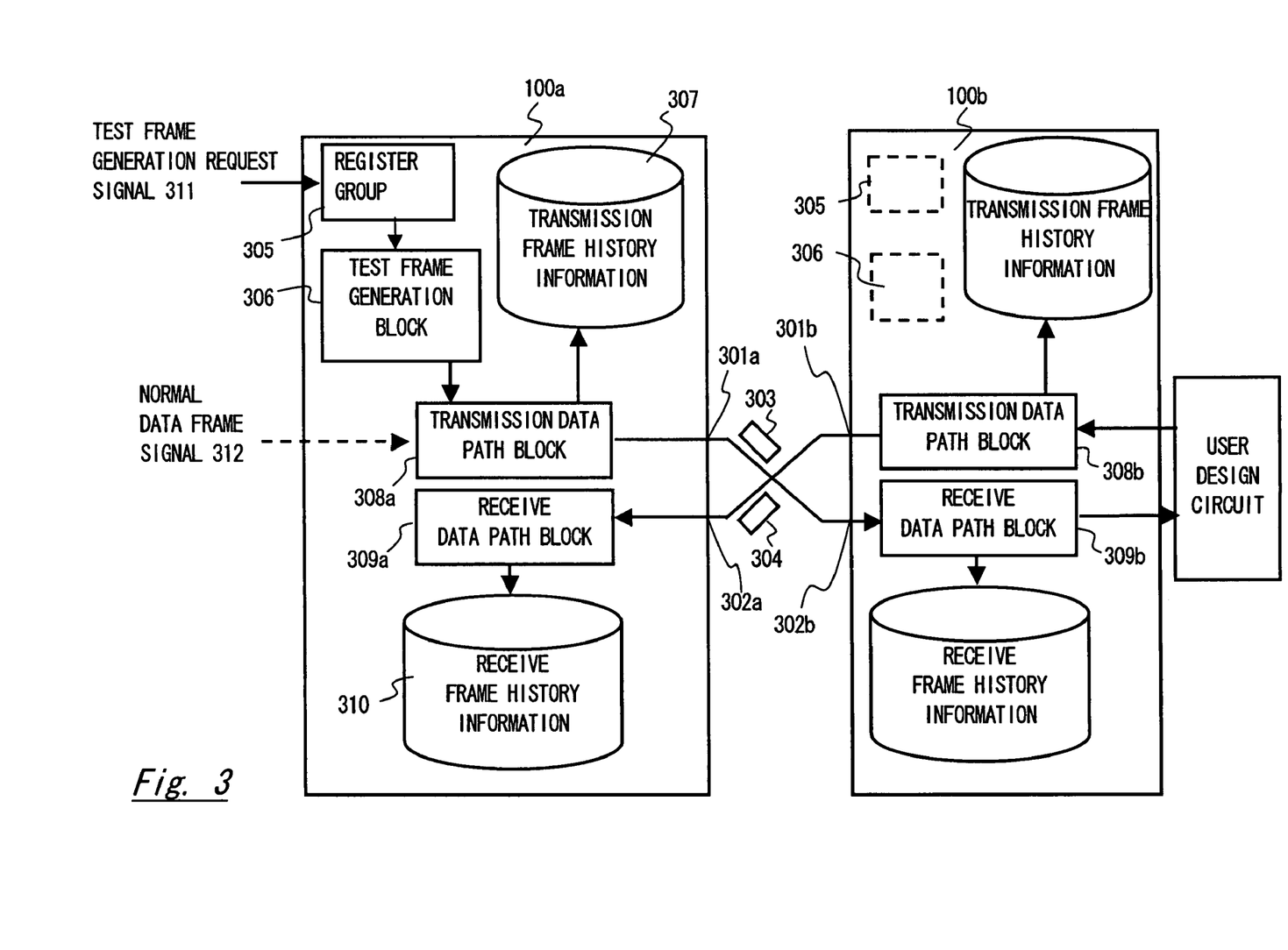
FIG. 3 is a block diagram depicting details of the configuration shown in FIG. 2.

FIG. 3 is a diagram depicting the detailed configuration of FIG. 2. Now the operation of verifying the transmission/receive functions of the frame data according to the verification method of the present invention will be described with reference to FIG. 3. In FIG. 3, the configuration related to the portion which operates as the test bench is primarily shown in the IP core 100a, and the configuration related to the transmission/reception operation of normal frame data is primarily shown in the IP core 100b. The IP cores 100a and 100b are identical circuits which as a rule are designed based on the same RTL description. In FIG. 3 however, the configuration corresponding to the test section 110 in the IP core 100b is shown only by a frame, of which description is omitted.

As FIG. 3 shows, the IP core 100a and the IP core 100b comprise the transmission ports 301a and 301b and the receive ports 302a and 302b respectively. The transmission port 301a of the IP core 100a transmits frame data 303, such as the later mentioned test frame, to the IP core 100b. The transmission port 301b of the IP core 100b sends the frame data 304, which corresponds to the output data of the IP core 100b, to the IP core 100a for test bench. The receive port 302a of the IP core 100a is a port for receiving the frame data 304 sent from the IP core 100b. The receive port 302b of the IP core 100b is a port for receiving the frame data 303 sent from the IP core 100a.

The IP core 100a comprises a register group 305, a test frame generation block 306, a transmission frame history information block 307a, a transmission data path block 308a, a receive data path block 309a and a receive frame history information block 310a. The test frame generation request signal 311, when functions are verified, and the normal frame data input signal 312 are applied to the IP core 100a.

The register group 305 is the set of various registers shown in FIG. 6, which are described later. The test frame generation block 306 is a section for generating frames for testing when a test frame generation is requested (the test frame generation request signal 311 is received). The transmission frame history block 307a stores the history information of the frame data 303 transmitted by the IP 100a. The transmission data path block 308a is disposed to adjust the format of the frame data 303 to be transmitted to the IP core 100*b*. The receive data path block 309*a* is disposed to extract necessary information from the received frame 304. The receive frame history block 310*a* stores the history information of the receive frame 304. Here the section having the register group 305 and the test frame generation block 306 in the IP core is the block corresponding to the test section 110 in FIG. 1.

Figure 7A:
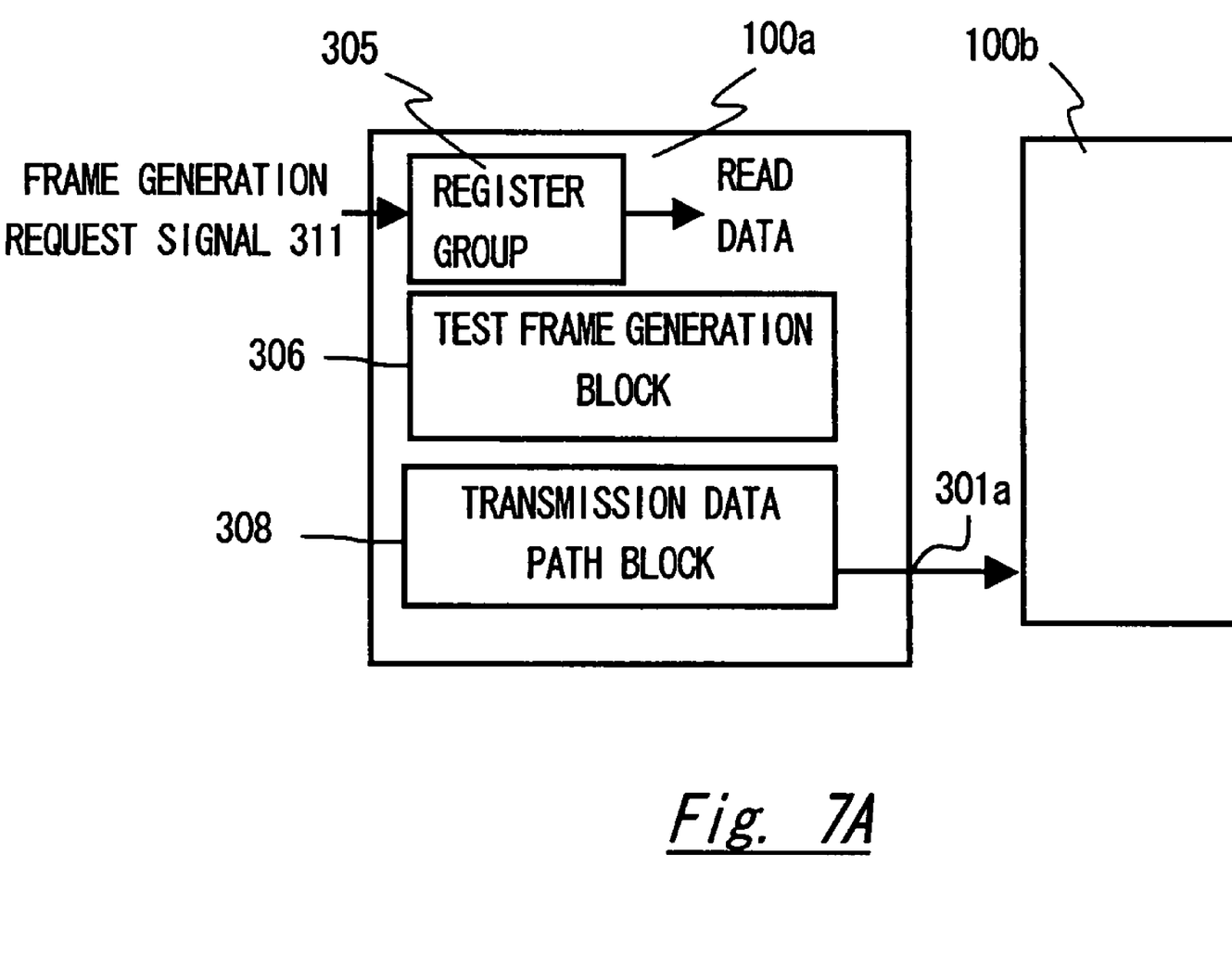
FIGS. 7A to 7C are diagrams depicting the transmission operation of a test frame according to an embodiment of the present invention.
Figure 7B:
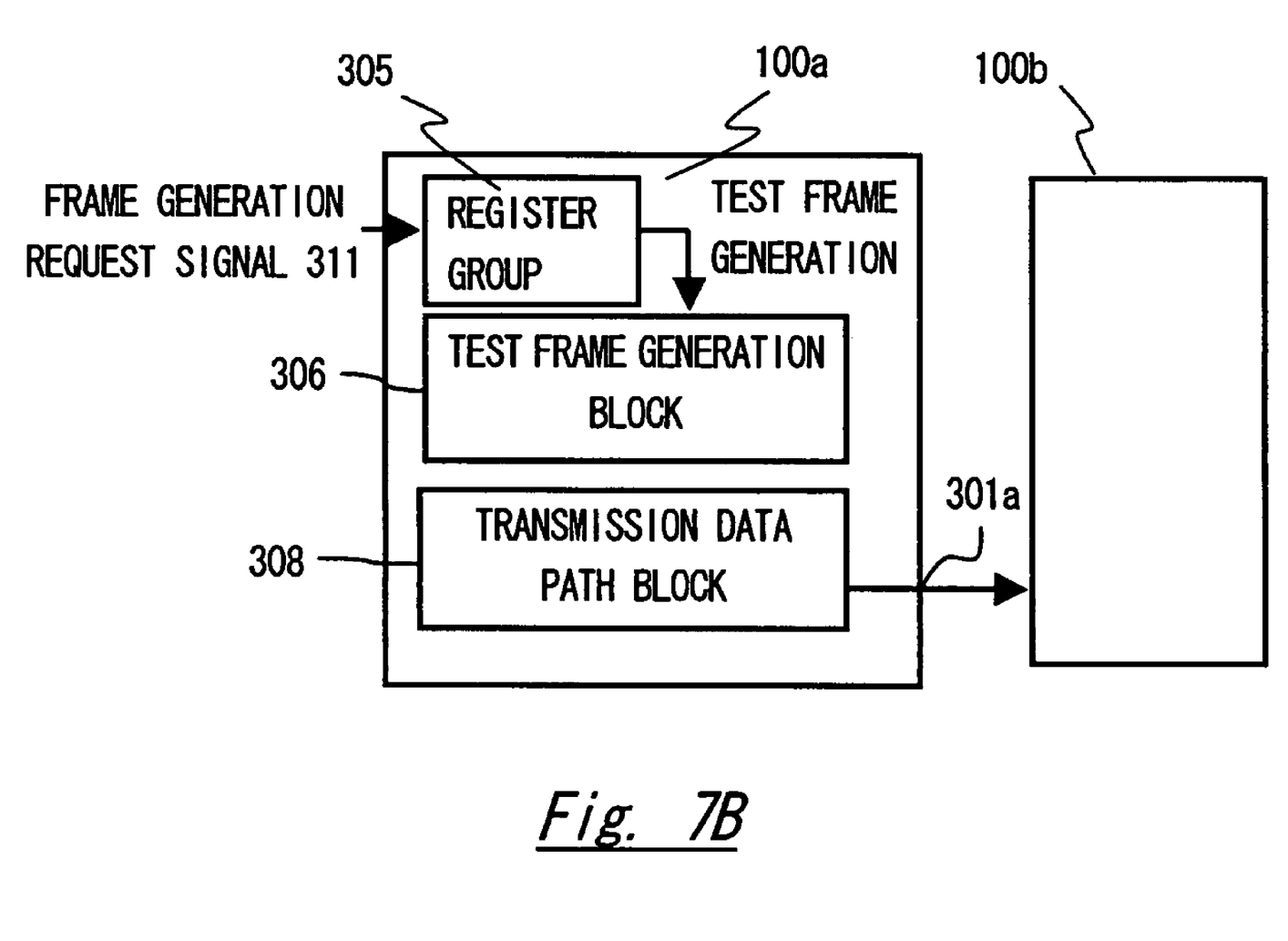
Figure 7C:
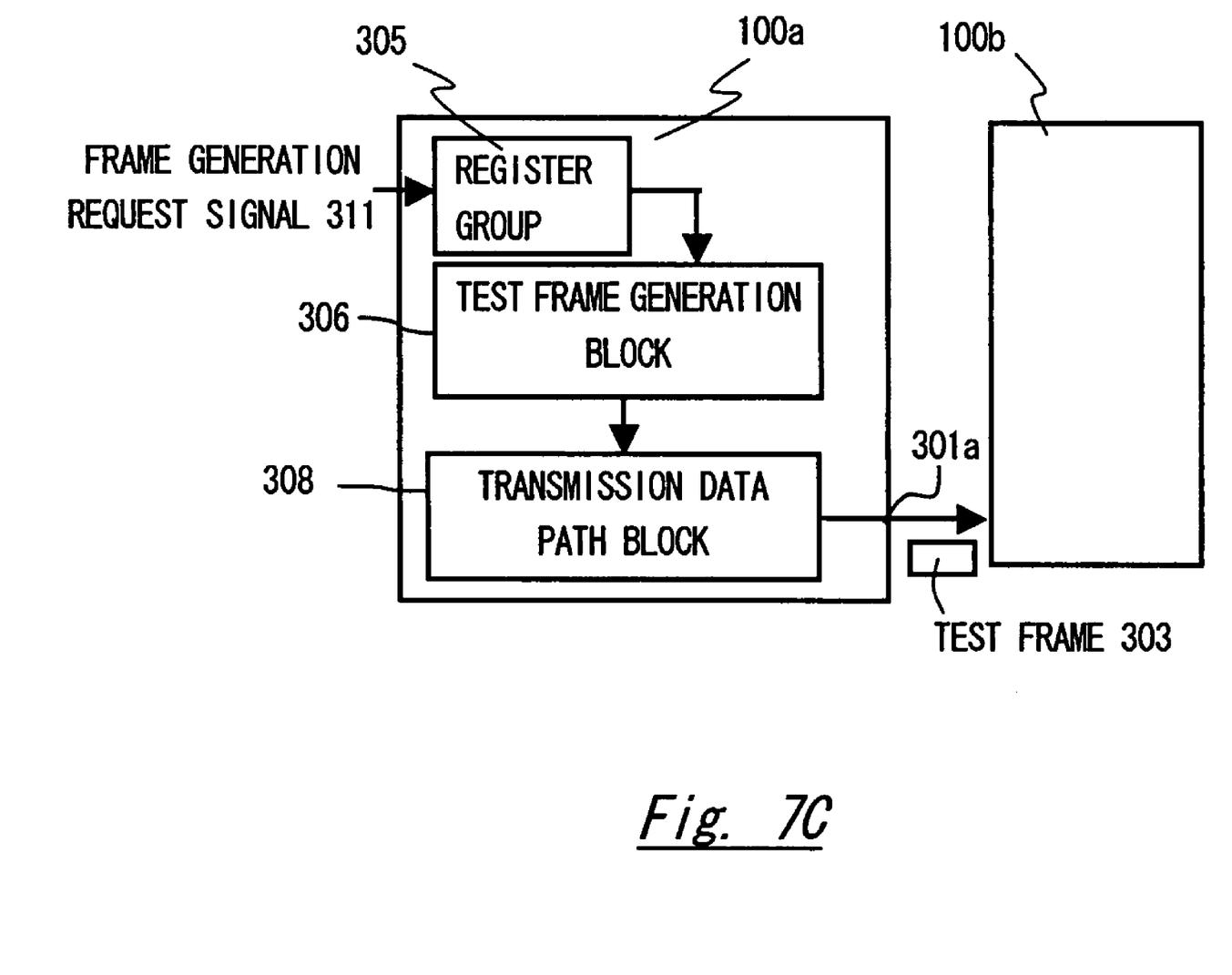

Now the operation when the test frame data is generated by this test section 110 (register group 305 and test frame generation block 306) and data is transmitted/received for the verification of the IP core 100*b* will be described. FIG. 7A–FIG. 7C are diagrams depicting the operation in each stage of the test frame data transmission.

Figure 4:
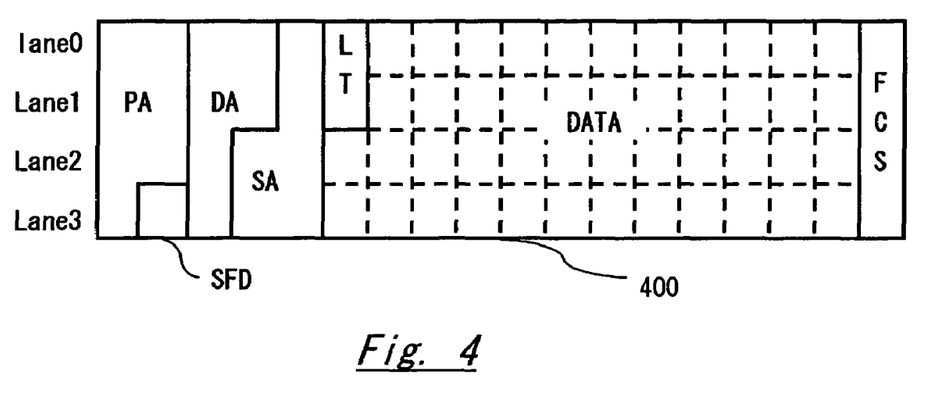
FIG. 4 is a diagram depicting the format of a frame of Ethernet®.

In the present embodiment, the basic unit of data to be exchanged between the circuit having the test bench function (IP core 100*a*) and the function block (IP core 100*b*) is a frame, as described above. FIG. 4 shows a general frame format of a 10 gigabit Ethernet® frame as an example.

As FIG. 4 shows, the frame 400 is comprised of a preamble (PA) field, Start Field Delimiter (SFD) field, determination-address (DA) field, source address (SA) field, length type (LT) field, data field (DATA) and Frame Check Sequence (FCS) field.

The PA field is a field to indicate the beginning of a frame and the SFD field is a field to indicate the start part of valid data. The DA field and the SA field are fields to indicate the destination address and the source address respectively, and the LT field is a field to indicate data or type in the frame. The DATA field is a field to check data content, and the FCS field is a field to check that frame data is correct. Data is exchanged in frame units in this way, but in the case of Ethernet®, for example, an entire frame size is not always the same since the DATA field length is variable.

Figure 5:
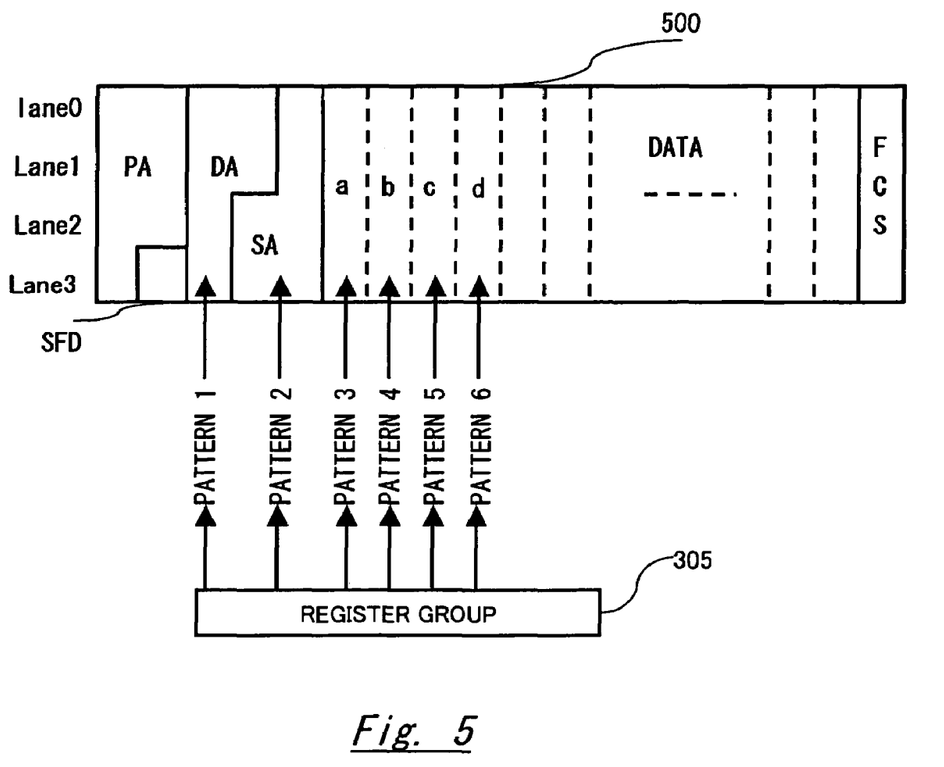
FIG. 5 is a diagram depicting the format of the test frame of an embodiment of the present invention.

FIG. 5 shows a format of a test frame 500 according to the embodiment of the present embodiment based on the format shown in FIG. 4. The format of the test frame 500 in FIG. 5 is a test frame 500 generated by the test frame generation block 306 in FIG. 3. FIG. 5 also shows the relationship between this test frame 500 and the register group 305. The relationship between the register group 305 and the test frame 500 shown in FIG. 5 shows that the pattern held in each register of the register group 305 is constructed as DA, SA and DATA fields of the test frame 500.

First according to the present embodiment, the test frame generation request signal 311 is sent to the IP core 100*a*, which executes the functions of the test bench. Based on this generation request signal 311, register values set in the register group 305 are read. The register values to be read here are those which were basically predetermined when the IP core 100 was designed, and is data for basic testing for verifying the functions related to transmission/reception when data is transmitted/received in frame units (see FIG. 7A).

Figure 6:
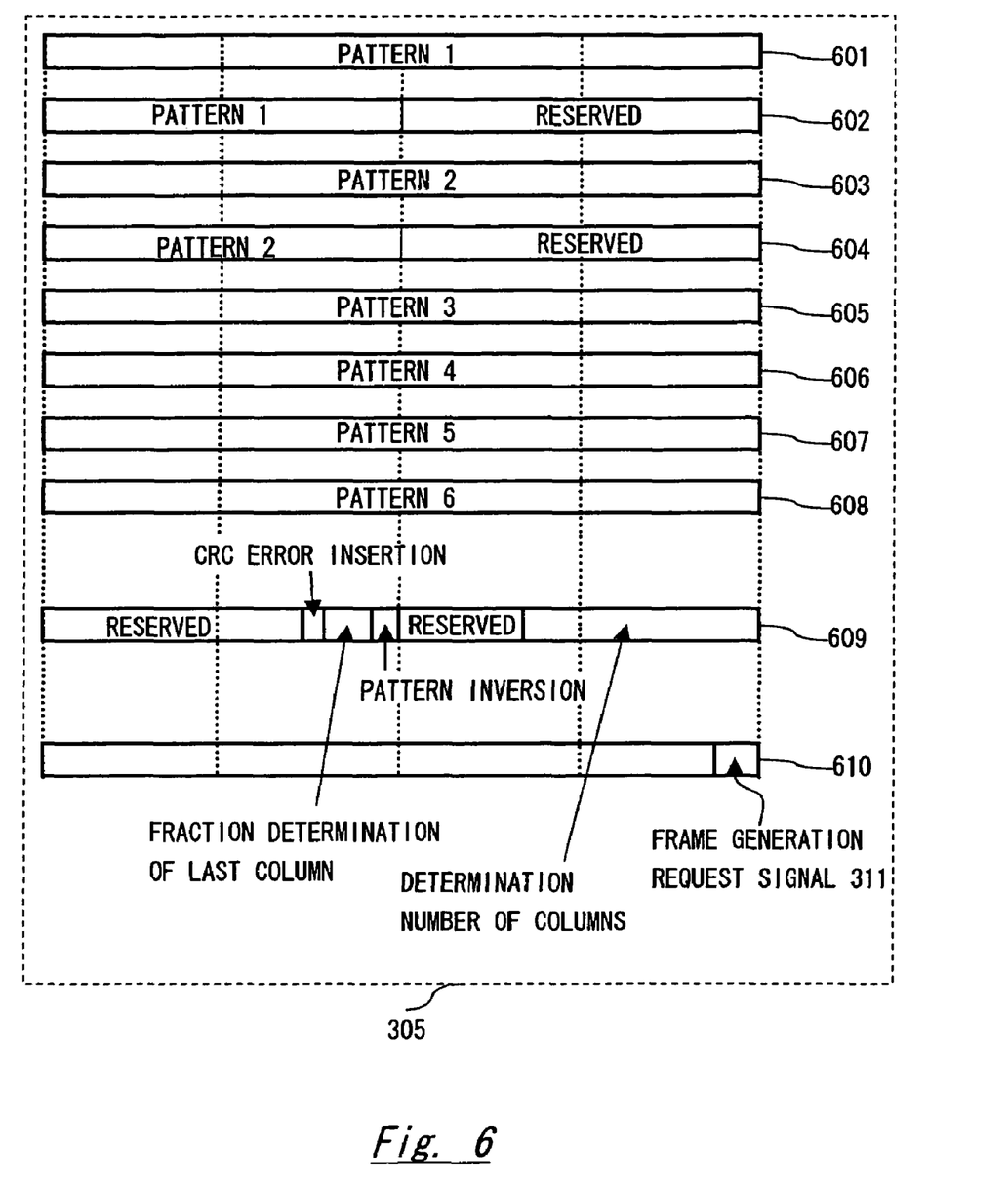
FIG. 6 is a diagram depicting a configuration of the register group of an embodiment of the present invention.

FIG. 6 is a diagram depicting the configuration of the above mentioned register group 305 used for generating the test frame 500. The registers 601–608 are registers for setting the data (bit pattern) for testing corresponding to the DA field, the SA field and the DATA field of the test frame respectively. The register 609 is a register for specifying the attributes of the frame (e.g. error insertion) other than a specific bit pattern specified by the registers 601–608. The register 610 is a register for accepting the test frame generation request signal 311.

By writing a value to be a flag in the register 610, the generation of the test frame 500 is started based-on the setting of the registers 601–608 and 609. This test frame 500 is created by the test frame generation block 306 based on the data held in the registers 601–608 and 609 (see FIG. 7B).

Then the generated test frame 500 is transmitted from the IP core 100*a* to the IP core 100*b* via the transmission data path block 308*a* in FIG. 3 and the transmission port 301*a* as frame data 303 (test frame 500) (see FIG. 7C).

The IP core 100*b* outputs the output data based on this transmitted test frame 500 as the frame data 304. This frame data 304 is received by the IP core 100*a*. This frame data 304 is then compared with the expected value of the output data to verify the functions of the IP core 100*b*. In other words, based on the frame data 304 which is output as the test frame 500, it is checked whether transmission/reception in frame units was performed accurately. In the present embodiment, the register group for holding the expected value of the output is not installed in the IP core 100*a*, but since the expected value is a value to be held in a register, the expected value register group may be installed in the IP core 100*a* separately from the register group 305 for test frame generation. In this case, the basic function verification (continuity check in frame units in this embodiment) of the IP core 100*b* may be performed in the IP core 100*a*.

Figure 8:
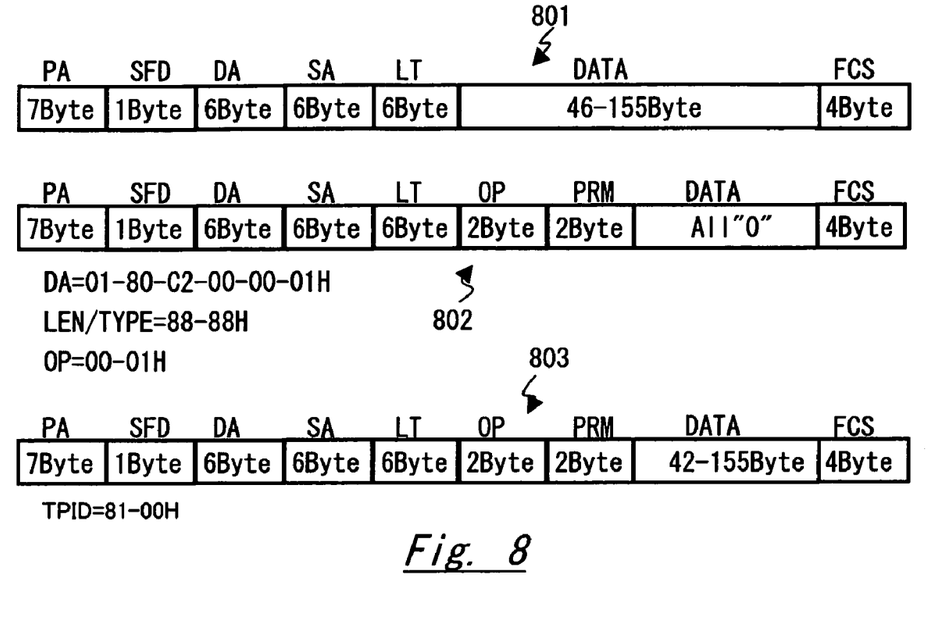
FIG. 8 is a diagram depicting another example of a test frame of an embodiment of the present invention.

FIG. 8 is a diagram depicting an example of a test frame for verification which can be generated by the IP core 100*a* in FIG. 3. The frame 801 is a normal frame, and the data field is variable. The frame 802 is a pause control frame. A pause control frame is a frame used for suppressing frame generation for the connected remote device (IP core 100*b* in FIG. 3). The period when the remote device suppresses frame generation is determined by the value specified in the PRM field of the frame. The frame 803 is a VLAN frame. This frame is a frame where a field called a VLAN (Virtual LAN) tag is added to the normal frame.

As FIG. 8 shows, the test frame that can be generated in this embodiment is held in the register group 305 in advance, as described above, but if the register group 305 is installed in the IP core 100, the content of the registers can be rewritten in RTL description if necessary. Therefore a frame can be generated with variation based on the register setting, such as the type of frame, size and inclusion of error insertion.

As described above, according to the present invention, the IP core 100, enclosing the test frame generation function, is connected with another IP core 100 with an identical configuration so as to execute the test bench function. This allows the execution of basic function verification without constructing a new test bench. Therefore the manpower required for test bench construction can be decreased, and the development period can be decreased. In the present embodiment, a frame can be generated with variation by a method of writing a value in the register group 305.

In other words, the IP core 100 of the present invention operates as a kind of function verification device by including a block for comparison with the expected value of the output data in the first function block (IP core 100*a*). According to the function verification device of the present invention, the test bench (IP core 100*a*), which is the first function block, has an identical configuration as the second function block (IP core 100*b*) to be the verification target. According to the function verification method of the present invention using this function verification device, the second function block (IP core 100*b*), to be the verification target for executing certain functions in the semiconductor integrated circuit, is prepared. Then the first function block (IP core 100*a*), to be a verification device having an identical configuration as the second function block (IP core 100*b*), is prepared. This step of preparing the first function block and the second function block corresponds to designing the IP core by RTL description, and the first and second function blocks are prepared by a programming language called HDL. The first function block and second function block are inter-connected at function verification. Then the data for testing (test frame) generated by the first function block is input to the second function block, and according to the output data of the second function block based on this data for testing, the function verification for the second function block is executed. In this way, the verification operation for the second function block is performed by the first function block, so the first function block can be used as the verification device, and the development period required for function verification can be decreased.

Figure 9:
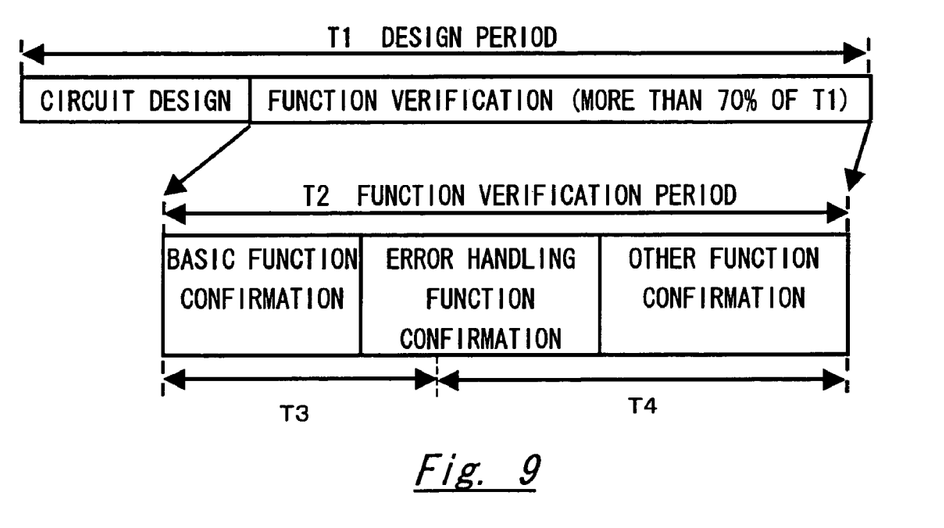
FIG. 9 is a diagram depicting the development period which is decreased by an embodiment of the present invention.

FIG. 9 is a diagram depicting the ratio of the function verification period in the entire circuit design and the breakdown of verification in the function verification period. The function verification period is regarded as 70% of the entire design period T1. By using the IP core 100 of the present invention as the test bench, the function verification from the confirmation of the basic frame transmission/receive functions and the confirmation of the frame handling function, including errors, can be handled. The entire function verification period T2 includes verification period T3 and verification period T4. The verification period T3 corresponds to the verification carried out by the IP core 100 of this invention. The verification period T4 corresponds to a verification carried out by other test benches. In the entire function verification period T2, the verification period T3 in FIG. 9 can be easily tested and the verification period T3 is decreased. Therefore, when the each IP core as an function block has a test bench, the entire function verification period is also decreased.

As described above, according to the present invention, a part of the test bench functions can be easily implemented. Therefore the function verification period, especially in the initial stage, can be decreased. Even when the IP core is integrated into FPGA or ASIC as a part of the functions, the manpower required for function verification can be decreased by writing predetermined values in the registers. If such an IP core is used for the IP core related to data communication in frame units, continuity can be easily checked in frame units, and the development period for function verification can be decreased.

It is apparent that the present invention is not limited to the above embodiment and it may be modified and changed without departing from the scope and spirit of the invention.

What is claimed is:

1. A function verification method comprising:
preparing a first function block that can execute required functions in a semiconductor integrated circuit;
preparing a second function block to be a verification target having a substantially identical configuration as the first function block, wherein the second function block is integrated with the semiconductor intergrated circuit; and
verifying functions of the second function block using the first function block; and
inputting data for testing generated by the first function block to the second function block, and verifying the functions of the second function block according to output data of the second function block based on the data for testing,
wherein the first function block and the second function block are inter-connected.

2. The function verification method according to claim 1, wherein the first and second function blocks are function blocks for performing data communication.

3. The function verification method according to claim 2, wherein preparing the first and second function blocks is describing the first and second function blocks by RTL.

4. The function verification method according to claim 1, wherein preparing the first and second function blocks is describing the first and second function blocks by RTL.

5. The function verification method according to claim 1, wherein the verifying the functions of the second function block is performed by the first function block.

6. The function verification method according to claim 1, wherein each of the first and second function blocks includes a test section, the method further comprising:
generating, by the test section of the first function block, test data to be sent out as frames of test data, wherein the generating step comprises:
obtaining data output from a register group in the test section of the first function block; and
partitioning the data output from the register group into a plurality of frames of data to be output to the second function block.

7. The function verification method according to claim 6, further comprising:
comparing, by the first function block, the output data of the second function block with stored output data from previous frames of data received from the second function block, the previous frames of data being stored in a memory of the first function block.

8. The function verification method according to claim 6, wherein the obtaining step comprises:
storing, in n registers of the register group, n being a positive integer greater than one, n different test data bit patterns, and
wherein the partitioning step comprises:
obtaining the n different test data bit patterns from the n registers in the register group and storing the n test data bit patterns in respective n fields of a current one of the plurality of frames of data.

9. A function verification method comprising:
generating frames of data for testing by a first function block for executing required functions in a semiconductor integrated circuit;
inputting the frames of data for testing to a second function block having a substantially identical configuration as the first function block, wherein the second function block is integrated with the semiconductor integrated circuit; and
verifying functions of the second function block according to output data that is output by the second function block based on the frames of data for testing,
wherein generating frames of data for testing by the first function block further comprises:
reading data corresponding to data provided within the frames of data for testing from a register group of the first function block, and assembling frames of data based on the data read from the register group of the first function block.

10. The function verification method according to claim 9, wherein each of the frames of data for testing includes a first field to indicate a beginning of the respective frame, a second field to indicate a start part of valid data in the respective frame, a third field to indicate a destination address, a fourth field to indicate a source address, a fifth field to indicate a type of data provided in the respective frame, a sixth field used to check data content, and a seventh field used to check that the respective frame is correct.

11. The function verification method according to claim 9, wherein each of the first and second function blocks includes a test section, the method further comprising:

generating, by the test section of the first function block, test data to be sent out as frames of test data, wherein the generating step comprises:

obtaining data output from a register group in the test section of the first function block; and partitioning the data output from the register group into a plurality of frames of data to be output to the second function block.

12. The function verification method according to claim 11, further comprising:

comparing, by the first function block, the output data of the second function block with stored output data from previous frames of data received from the second function block, the previous frames of data being stored in a memory of the first function block.

13. The function verification method according to claim 11, wherein the obtaining step comprises:

storing, in n registers of the register group, n being a positive integer greater than one, n different test data bit patterns, and wherein the partitioning step comprises:

obtaining the n different test data bit patterns from the n registers in the register group and storing the n test data bit patterns in respective n fields of a current one of the plurality of frames of data.

* * * * *